United States Patent
Chae (10) Patent No.: US 8,107,037 B2
(45) Date of Patent: Jan. 31, 2012

(54) DISPLAY DEVICE AND FABRICATION METHOD THEREOF

(75) Inventor: Gee-Sung Chae, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/074,833

(22) Filed: Mar. 29, 2011

(65) Prior Publication Data

US 2011/0176090 A1 Jul. 21, 2011

Related U.S. Application Data (62) Division of application No. 11/640,556, filed on Dec. 18, 2006, now Pat. No. 7,936,421.

(30) Foreign Application Priority Data

Dec. 30, 2005 (KR) .............................. 136188/2005

(51) Int. Cl.
*G02F 1/1335* (2006.01)
*G02F 1/133* (2006.01)
*G02F 1/136* (2006.01)
*H01J 1/62* (2006.01)

(52) U.S. Cl. .............. 349/69; 349/71; 349/116; 349/43; 313/506; 313/504

(58) Field of Classification Search .................... 349/69, 349/71, 116

See application file for complete search history.

(56) References Cited

U.S. PATENT DOCUMENTS

| 6,489,044 | B1 * | 12/2002 | Chen et al. ................... 428/690 |
| 6,912,021 | B2 * | 6/2005 | Kimura ........................... 349/69 |
| 7,400,261 | B2 | 7/2008 | Watanabe et al. |
| 7,622,863 | B2 | 11/2009 | Seo et al. |

* cited by examiner

*Primary Examiner* — Wen-Ying P Chen
(74) *Attorney, Agent, or Firm* — Brinks Hofer Gilson & Lione

(57) ABSTRACT

A display device and its fabrication method are disclosed. According to one aspect, the method for fabricating a display device includes forming a first element unit including a first reflector layer, a light emitting part and a common electrode on a lower substrate, and forming a second element unit including a floating electrode, a photocurrent layer and a signal electrode on the first element unit. A third element unit is formed on the lower substrate. The third element unit includes a second reflector layer connected with the floating electrode and also a second light emitting part and a second floating electrode disposed on the second reflector layer.

4 Claims, 7 Drawing Sheets

DISPLAY DEVICE AND FABRICATION METHOD THEREOF

The present patent document is a divisional of U.S. patent application Ser. No. 11/640,556, filed Dec. 18, 2006 now U.S. Pat. No. 7,936,421, which claims priority to Korean Patent Application No. 136188/2005 filed in Korea on Dec. 30, 2005, which is hereby incorporated by reference.

BACKGROUND

1. Field of the Invention

The present disclosure relates to a display device and its fabrication method and, more particularly, to a display device in which upper and lower electrodes function as source and drain electrodes of thin film transistors by using upper and lower path centering on a polymer as a movement path of electric charges, and its fabrication method.

2. Discussion of the Related Art

Today, liquid crystal display devices (LCDs) are widely used as flat panel displays (FPDs) due to their low weight and small power consumption.

However, because the LCD is a light-receiving device, not a self-emitting display, and due to technical limitations with respect to brightness, contrast, viewing angle and size, efforts are underway to develop a new flat panel display that may overcome the shortcomings of the LCD.

An organic electroluminescence device, a new type of flat panel display, is a self-emitting device, has a good viewing angle and contrast compared with the LCD, and can be light-weight, thin and advantageous in terms of power consumption because it does not require a backlight.

In addition, the organic electroluminescence device can be driven at a low DC voltage, has a fast response speed, is resistant to external impacts because it is entirely solid, has a wide usage temperature range and incurs a low fabrication cost.

In particular, in contrast to the LCD or a plasma display panel (PDP), a fabrication process of the organic electroluminescence device is quite simple and entails using only deposition and encapsulation equipment.

In the related art, a passive matrix type driving method that does not have thin film transistors (TFTs) is commonly employed to drive the organic electroluminescence device.

However, in the passive matrix type driving method, elements are formed in a matrix that scan lines and signal lines cross, so in order to drive each pixel, the scan lines should be sequentially driven over time.

In order to obtain a desired average luminance, an instantaneous luminance obtained by multiplying the number of lines by an average luminance should be obtained.

Accordingly, in this method, as the lines increase in number, a higher voltage and more current may be instantaneously applied, accelerating degradation of elements and increasing power consumption, so passive matrix electroluminescent display technology may not be suitable for high resolution large-scale displays.

However, in an active matrix display, the TFTs for switching each pixel are positioned at each pixel.

A first electrode of the TFT turns on or off each of the pixels, and a second electrode facing the first electrode is used as a common electrode.

In the active matrix display, voltage applied to a pixel is charged in a storage capacitor to apply power until a next frame signal is applied, so it may be continuously driven during one screen regardless of the number of scan lines.

Accordingly, with the active matrix display, even though only a low current is applied, the same luminance as with the passive matrix display may be obtained with low power consumption, good image resolution (minuteness or fineness) and increased size.

Characteristics of a basic structure and operation of the active matrix type organic electroluminescence device will now be described.

Figure 1:
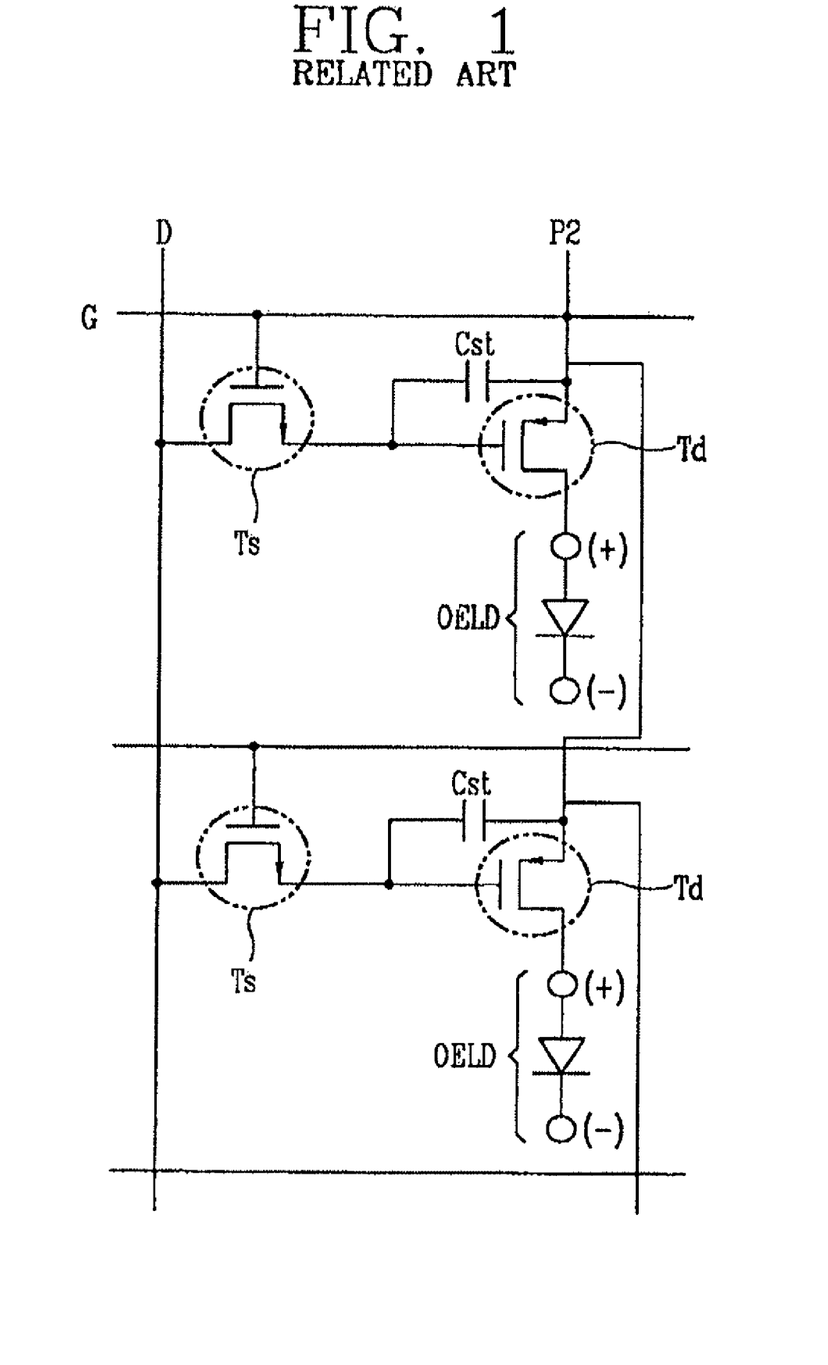
FIG. 1 shows a basic pixel structure of a general active matrix type organic electroluminescence (EL) device.

FIG. 1 shows the basic pixel structure of a general active matrix type organic electroluminescence device.

As shown in FIG. 1, scan lines G are formed in a first direction on a substrate, and signal lines D and power supply lines P2 are formed separately at certain intervals in a second direction perpendicular to the first direction.

A region formed where the scan line G and the signal line D cross is defined as a single pixel area.

A switching TFT Ts, an addressing element, is formed near the crossing of the scan line G and the signal line D.

A storage capacitor Cst is formed to be connected with the switching TFT and the power supply line P2.

A driving TFT Td, a current source element, is formed to be connected with the storage capacitor Cst and the power supply line.

An organic electroluminescent diode (OELD) is connected with the driving TFT Td.

When current is supplied in a forward direction to an organic light emitting material of the organic electroluminescent diode (OELD), electrons and holes are moved through a P (positive)-N (negative) junction part between an anode (anode electrode), which serves as a hole providing layer, and a cathode (cathode electrode), which serves as an electron providing layer, and they recombine to move from a higher energy to a lower energy state. Accordingly, the organic electroluminescent diode uses the principle that light is emitted due to the energy difference.

In this case, the switching TFT Ts serves to control voltage and store the current source.

The driving principle of the active matrix type organic electroluminescent (EL) device will now be described.

In the active matrix type organic EL device, when a signal is applied to a corresponding electrode according to a selection signal, a gate of the switching TFT is turned on and a data signal passes through the gate of the switching TFT so as to be applied to the driving TFT and the storage capacitor.

When a gate of the driving TFT is turned on, current is applied from the power supply line through the gate to illuminate an organic electroluminescent layer.

The opening/closing degree of the gate of the driving TFT differs according to a size of the data signal, so by controlling the amount of current flowing through the driving TFT, a gray scale can be represented.

During a non-selection interval, data charged in the storage capacitor is continuously applied to the driving TFT to continuously illuminate the organic EL device until a signal of a next screen is applied.

Based on this principle, in the active matrix type organic EL device, a low voltage and an instantaneously low current compared with the passive matrix type organic EL device can be applied.

In addition, the active matrix type organic EL device can be continuously driven during a single screen time regardless of the number of selection lines, and thus it may allow a low power consumption, high resolution and large area.

The active matrix type organic EL device operates by current flow through TFTs.

In the related art, amorphous silicon (a-Si) TFTs have a low electric field effect mobility, so polycrystalline silicon (polysilicon or p-Si) TFTs with good electric field effect mobility and uniform grains are required.

Polysilicon TFTs can generate a driving circuit on the substrate with a high electric field effect mobility, so by directly forming a driving circuit with the polysilicon TFTs on the substrate, a cost for a driving IC can be reduced and mounting may be simplified.

A method for fabricating TFTs by using the related art organic EL device fabrication method will now be described with reference to FIGS. 2A to 2E.

FIGS. 2A to 2E are process sectional views showing a method for fabricating a TFT according to the related art.

Figure 2A:
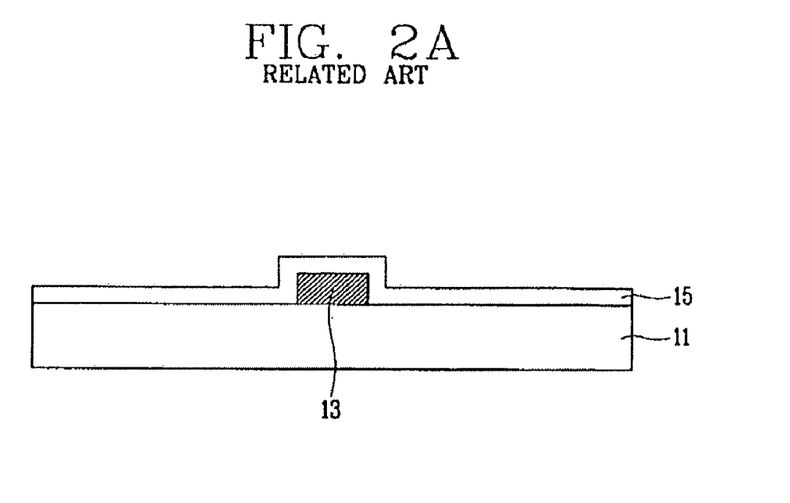
FIGS. 2A to 2E are process sectional views showing a method for fabricating a TFT to be applied for the active matrix type organic EL device.

Referring to FIG. 2A, a metallic material is deposited on the substrate 11 and selectively patterned through exposing and developing processes by using photolithography to form a gate electrode 13 on the substrate 11.

Figure 2B:
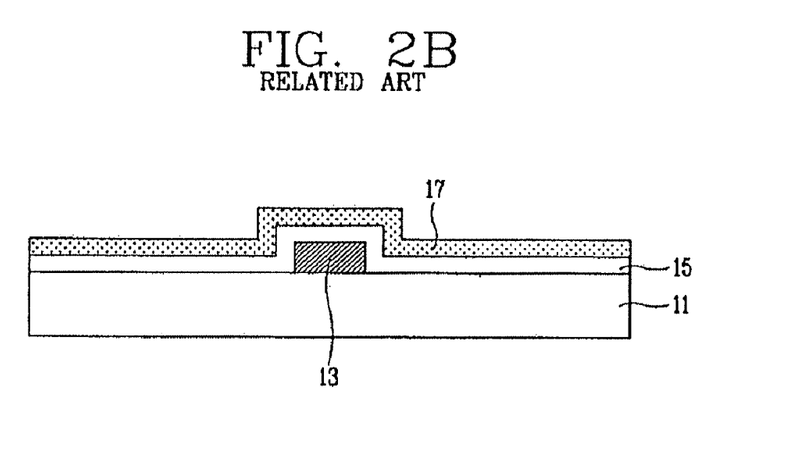

Next, referring to FIG. 2B, a gate insulation film 15 and an active layer 17 are sequentially deposited on the entire surface of the substrate including the gate electrode 13.

To deposit the active layer 17, PECVD equipment, which is generally expensive, or other deposition equipment can be used.

Figure 2C:
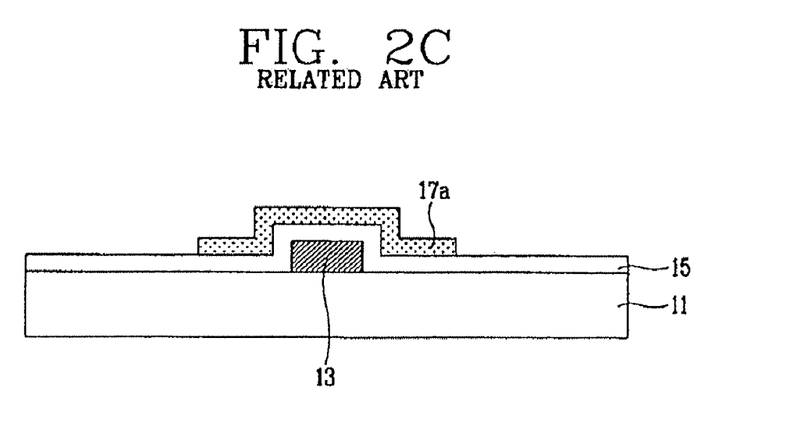

And then, referring to FIG. 2C, the active layer 17 is selectively patterned through the exposing and developing process by using photolithography to form an active layer pattern 17a.

Figure 2D:
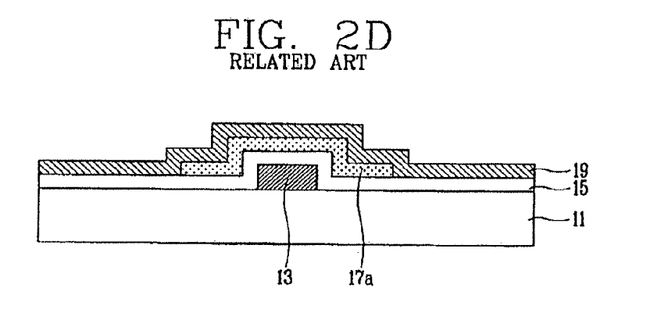

Thereafter, with reference to FIG. 2D, a metallic conductive layer 19 is deposited on the entire surface of the substrate including the active layer pattern 17a.

Figure 2E:
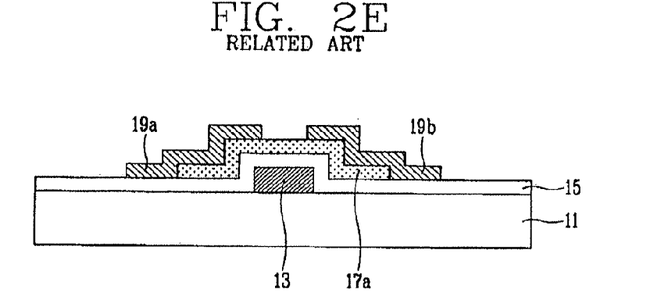

With reference to FIG. 2E, the metallic conductive layer 19 is selectively patterned through the exposing and developing process using photolithography to form source and drain electrodes 19a and 19b, thereby completing fabrication of the TFT.

However, according to the related art, because expensive PECVD equipment is used to form the active layer of the TFT structure, material costs and processing time increase and productivity drops.

BRIEF SUMMARY

Described herein is a display device in which upper and lower electrodes use upper and lower path centering on a polymer as a movement path of electric charge and thus comprise source and drain electrodes of thin film transistors, and its fabrication method.

The display device includes, according to one embodiment, a first element unit disposed on a lower substrate and including a first reflector layer, a light emitting part and a common electrode, and a second element unit disposed on the first element unit and including a floating electrode, a photocurrent layer and a signal electrode. A third element unit is disposed on the lower substrate and includes a second reflector layer connected with the floating electrode and also a second light emitting part and a second floating electrode disposed on the second reflector layer.

There is also provided a display device including, according to another embodiment, a first element unit disposed on a lower substrate and including a reflector layer, a first light emitting part and a common electrode, and a second element unit disposed on the first element unit and including a floating electrode, a photocurrent layer and a signal electrode. An upper substrate is disposed in opposition to the lower substrate, and a liquid crystal layer is disposed between the lower and upper substrates.

There is also provided a method for fabricating a display device including, according to one aspect, forming a first element unit including a first reflector layer, a light emitting part and a common electrode on a lower substrate, and forming a second element unit including a floating electrode, a photocurrent layer and a signal electrode on the first element unit. A third element unit is formed on the lower substrate, and the third element unit includes a second reflector layer connected with the floating electrode and also a second light emitting part and a second floating electrode disposed on the second reflector layer.

There is also provided a method for fabricating a display device including, according to another aspect, forming a first element unit including a reflector layer, a light emitting part and a common electrode on a lower substrate, and forming a second element unit including a floating electrode, a photocurrent layer and a signal electrode on the first element unit. The lower substrate is attached to an upper substrate, and a liquid crystal layer is formed between the lower and upper substrates.

DETAILED DESCRIPTION OF THE DRAWINGS AND THE PRESENTLY PREFERRED EMBODIMENTS

The display device and its fabrication method will now be described with reference to the accompanying drawings.

Figure 3:
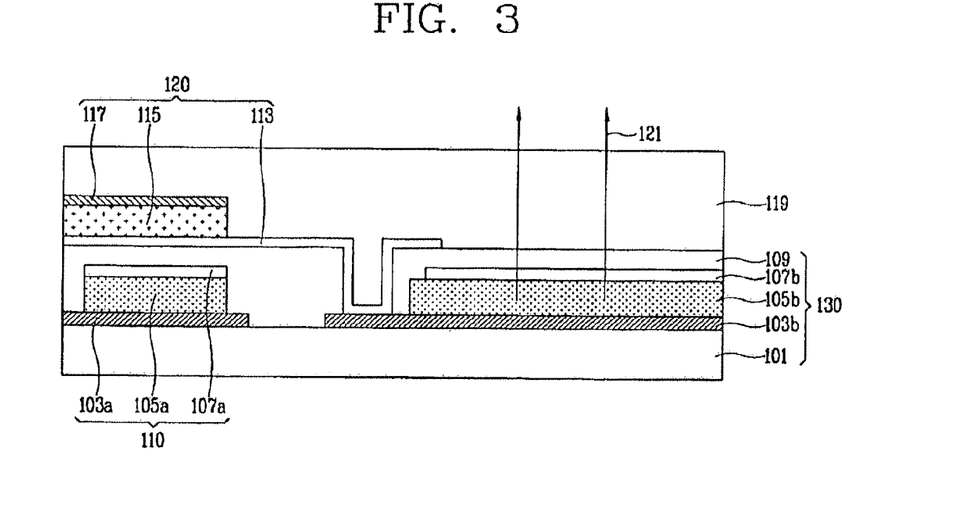
FIG. 3 is a sectional view showing an organic EL device according to one embodiment.

FIG. 3 is a sectional view showing an organic electroluminescence (EL) device according to one embodiment.

Referring to FIG. 3, the organic EL device according to one embodiment includes: a first polymer unit 110 including a first reflector layer 103a, namely, a pulse electrode, a light emitting part 105a, and a common electrode 107a formed on a lower substrate 101; a second polymer unit 120 including a floating electrode 113, a photocurrent layer 115 and a signal electrode 117 formed at an upper side of the first polymer unit 110 separated from the first polymer unit 110 at a certain distance; and a third polymer unit 130 including a second reflector layer 103b formed on the lower substrate 101 and connected with the floating electrode 113 and a second light emitting part 105b formed on the second reflector layer 103b, and a second floating electrode 107b.

Herein, a first passivation layer 109 is formed between the first and second polymer units 110 and 120, and a second passivation layer 119 is formed on the second polymer unit 120.

Upper and lower electrodes 117 and 113 are used as source and drain electrodes of TFTs by using an upper and lower path centering on the second polymer unit 120 as movement path of electric charges.

In a method for activating the second polymer unit 120 (e.g., 2,5-pyridinediyl) used as an active layer in the absence of a gate electrode of a related art TFT, the first polymer unit 110 is utilized. Namely, the organic EL device is constructed by using the first polymer unit 110 as an illumination layer.

A method for fabricating the organic EL device constructed as described above will now be explained with reference to FIGS. 4A to 4E.

FIGS. 4A to 4E are process sectional views showing a fabrication process of the organic EL device according to one embodiment.

Figure 4A:
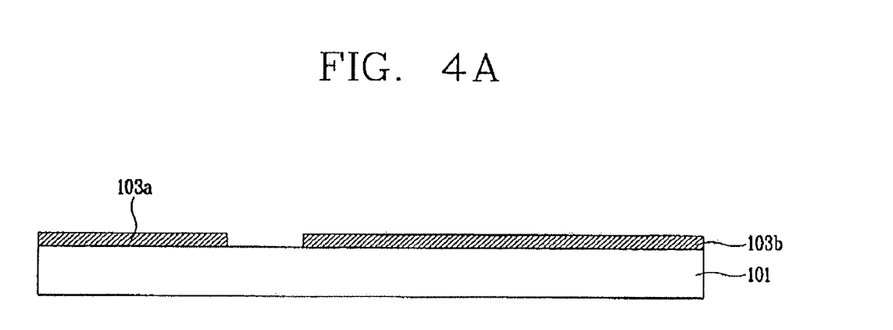
FIGS. 4A to 4E are process sectional views showing a fabrication process of the organic EL device according to one embodiment.

Referring to FIG. 4A, first, a conductive material layer is deposited on an insulation substrate 101 and selectively patterned through an exposing and developing process by using photolithography to form a pulse electrode 103a serving as a reflection layer of the first polymer unit and a lower electrode 103b of the third polymer unit 130.

Figure 4B:
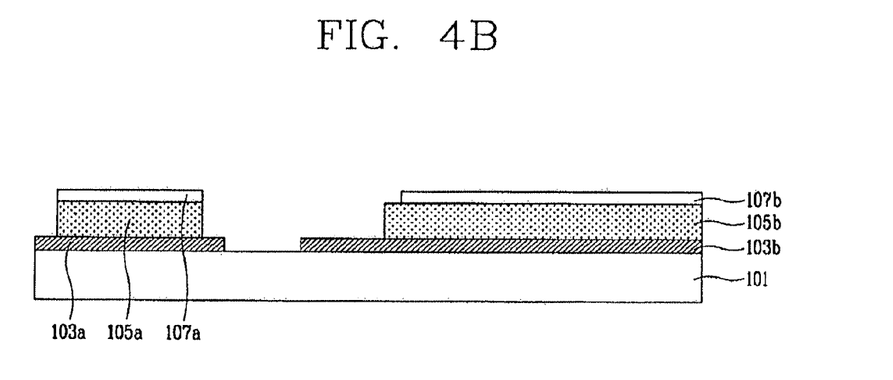

Next, referring to FIG. 4B, a light emission material layer and a common electrode-forming transparent material layer are deposited on the entire surface including the pulse electrode 103a of the first polymer unit 110 and the lower electrode 103b of the third polymer unit 130 in order to form a light emission layer.

And then, the transparent material layer is selectively patterned through the exposing and developing process by using the photolithography to form light emission layers 105a and 105b and common electrodes 107a and 107b on the pulse electrode 103a and the lower electrode 103b.

Figure 4C:
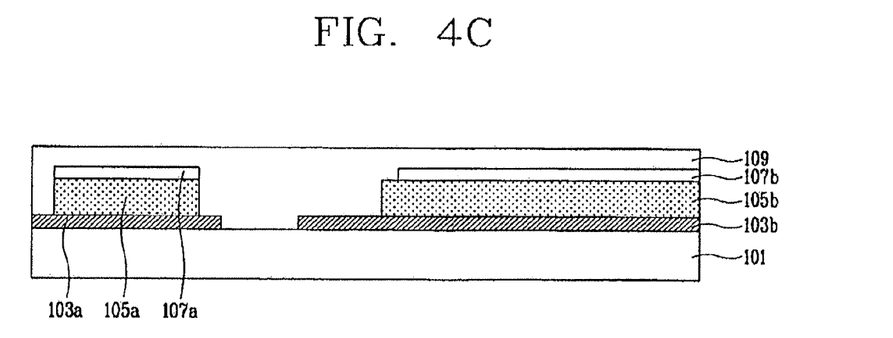

Subsequently, as shown in FIG. 4C, a first passivation layer 109 is deposited on the entire surface of the substrate including the light emission layers 105a and 105b and the common electrodes 107a and 107b.

Figure 4D:
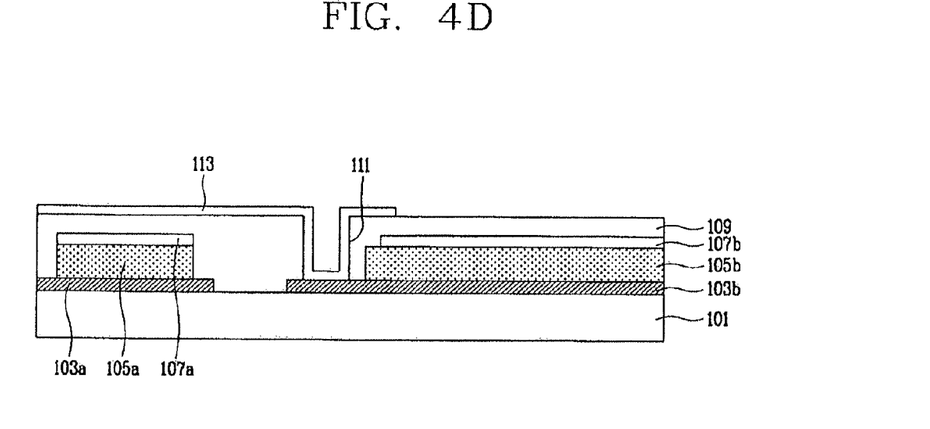

Thereafter, as shown in FIG. 4D, the first passivation layer 109 is selectively patterned through the exposing and developing process by using photolithography to form a lower electrode contact hole 111 exposing the lower electrode 103b of the third polymer unit 130.

And then, a transparent material is deposited on the first passivation layer 109 including the lower electrode contact hole 111 and selectively patterned through the exposing and developing process by using photolithography to form a lower electrode 113 of the second polymer unit 120.

In this case, the lower electrode 113 of the second polymer unit 120 is electrically connected with the lower electrode 103b of the third polymer unit 130.

Figure 4E:
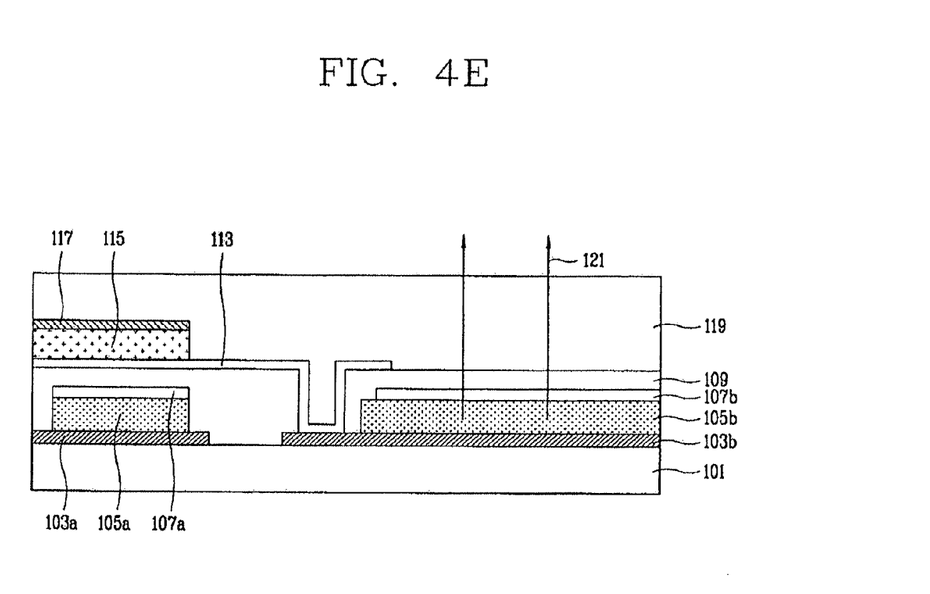

And then, with reference to FIG. 4E, a material for forming a photocurrent media layer is deposited on the first passivation layer 109 including the lower electrode 113 of the second polymer unit 120.

Subsequently, a conductive material layer for forming a signal electrode is deposited on the material layer for forming the photocurrent media layer.

Thereafter, the conductive material layer and the photocurrent media layer are selectively patterned through the exposing and developing process by using photolithography to form a photocurrent media layer 115 and a signal electrode 117 at positions corresponding to the first polymer unit 110.

And then, the second passivation layer 119 is deposited on the first passivation layer 109, including the photocurrent media layer 115 and the signal electrode 117, for planarization.

The organic EL device fabricated as described above is illuminated while applying a certain pulse type signal (namely, a gate signal of a general TFT), and the second polymer unit 120 is activated while generating photocurrent by the generated light.

At this time, a video signal is applied through the signal electrode 117 to apply current or a certain voltage to the third polymer unit 130 through the floating electrode 113, which is the lower electrode of the second polymer unit 120, to thus operate the third polymer unit 130.

In order to prevent noise due to an external tube, the upper electrode 117 of the second polymer unit 120 and the lower electrode 103a of the first polymer unit 110 may be made of a metal (e.g., aluminum) with high electrical conductivity and high reflectivity.

The lower electrode 113 of the second polymer unit and the upper electrode 107a of the first polymer unit may be made of a conductive material with good light transmittance, for example, indium-tin oxide (ITO).

Compared with the general TFT, the dimension of an electrical conduction path in the current TFT is about 100,000 times greater, so although the current TFT has an electric conductivity (the second polymer unit) in the range of 1/10,000~100,000, no problems arise in operating the device.

In implementing the structure, sputtering, evaporation and organic film coating equipment, which do not substantially increase processing costs, are used, and thus productivity may be considerably improved.

When the structure of the third polymer unit is employed for the organic EL device, a display is implemented on the related art single substrate.

In a different embodiment, a structure of an LCD when the structure of the third polymer unit is used as a liquid crystal material will now be described in detail with reference to FIG. 5.

Figure 5:
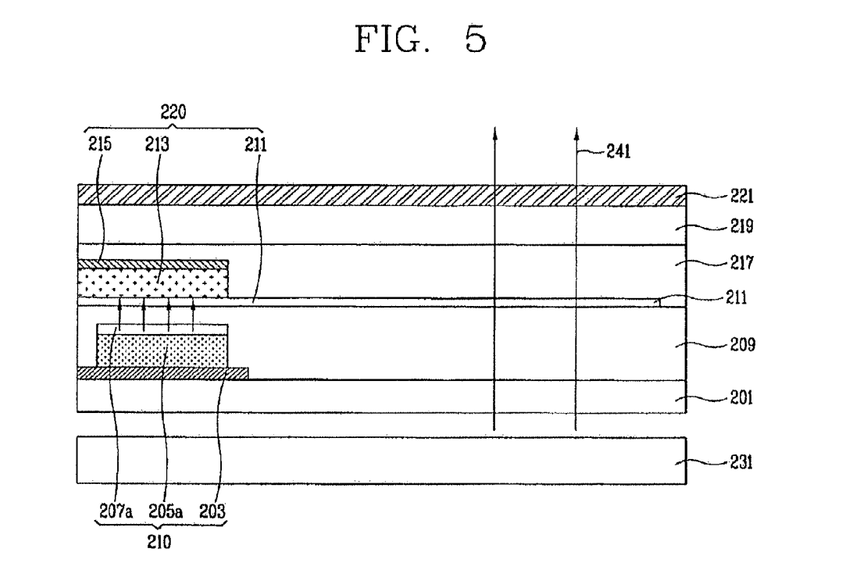
FIG. 5 is a process sectional view showing a liquid crystal display (LCD) according to another embodiment.

FIG. 5 is a sectional view showing a liquid crystal display (LCD) according to another embodiment.

Referring to FIG. 5, an LCD according to another embodiment includes a first polymer unit 210 including a reflector layer 203, a pulse electrode, a light emitting part 205a and a common electrode 207a formed on a lower substrate 201; a second polymer unit 220 including a floating electrode 211, a photocurrent layer 213 and a signal electrode 215 formed at an upper side of the first polymer unit 210 separated from the first polymer unit 210 at a certain distance; an upper substrate 221 disposed at an upper side of the lower substrate 201, on which the first and second polymer units 210 and 220 are formed, with a certain gap therebetween; a liquid crystal layer 219 formed between the lower substrate 201 and the upper substrate 221; and a backlight 231 disposed on a rear surface of the lower substrate 201 and providing a light source to a front surface.

Herein, a first passivation layer 209 is formed between the first and second polymer unit 210 and 220, and a second passivation layer 217 is formed on the second polymer unit 220.

The upper and lower paths centering on the second polymer unit 220 are used as movement paths of electric charges to thus utilize the upper and lower electrodes as source and drain electrodes of the TFT.

The first and second polymer units 210 and 220 are disposed to face each other, and the floating electrode 211 of the second polymer unit 220 extends to face the substantially the entire surface of the lower substrate 201.

The method for fabricating the LCD constructed as described above will now be described with reference to FIGS. 6A to 6E.

FIGS. 6A to 6E are process sectional views showing the LCD according to another embodiment.

Figure 6A:
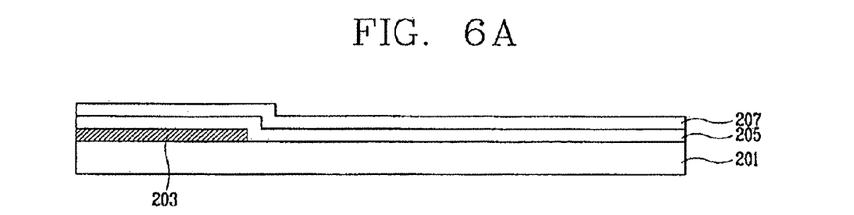
FIGS. 6A to 6E are process sectional views showing the LCD according to another embodiment.

Referring to FIG. 6A, a conductive material layer is deposited on an insulation substrate 201 and selectively patterned through the exposing and developing process by using photolithography to form a reflection layer 203 serving as a reflection layer of the first polymer unit. In this case, the reflection layer is used as a pulse electrode.

Next, a light emission material layer 205 and a common electrode-forming transparent material layer 207 are sequentially deposited on the entire surface of the substrate including the reflection layer 203 of the first polymer unit 210 in order to form a light emission layer.

Figure 6B:
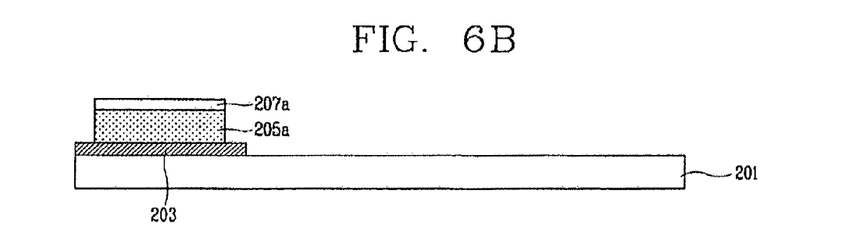

Subsequently, with reference to FIG. 6B, the light emission material layer 205 and the transparent material layer 207 are selectively patterned through the exposing and developing process by using photolithography to form a light emission layer 205a and a common electrode 207a on the pulse electrode 203.

Figure 6C:
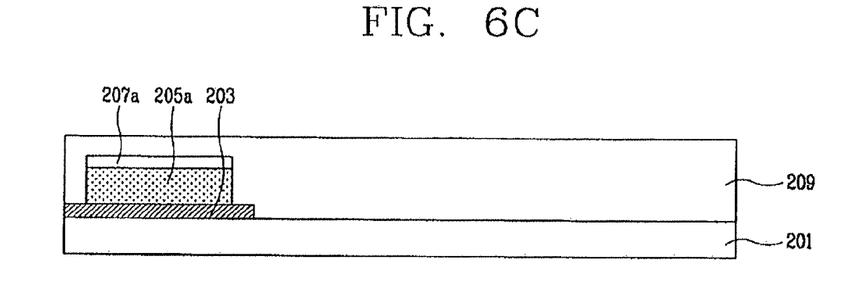

And then, with reference to FIG. 6C, a first passivation layer is deposited with a certain thickness or greater on the entire surface of the substrate including the light emission layer 205a and the common electrode 207a.

Figure 6D:
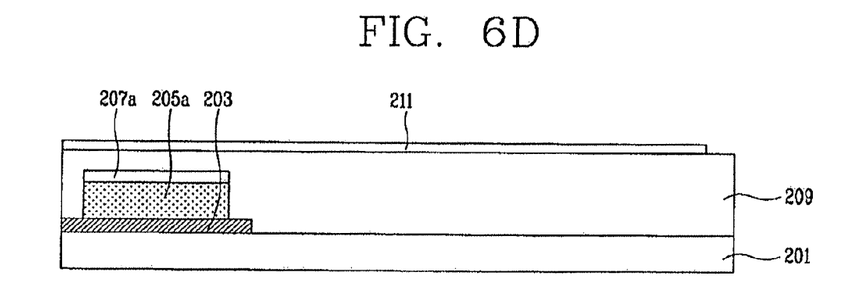

Thereafter, as shown in FIG. 6D, a conductive layer (not shown) to be used as the floating electrode of the second polymer unit 220 is deposited on the first passivation layer 209. In this case, the conductive layer is made of a transparent material such as ITO.

And then, the conductive layer (not shown) is selectively patterned through the exposing and developing process using photolithography to form the floating electrode 211 of the second polymer unit 220. In this case, the floating electrode 211 is formed to face substantially the entire surface of the lower substrate 201.

Figure 6E:
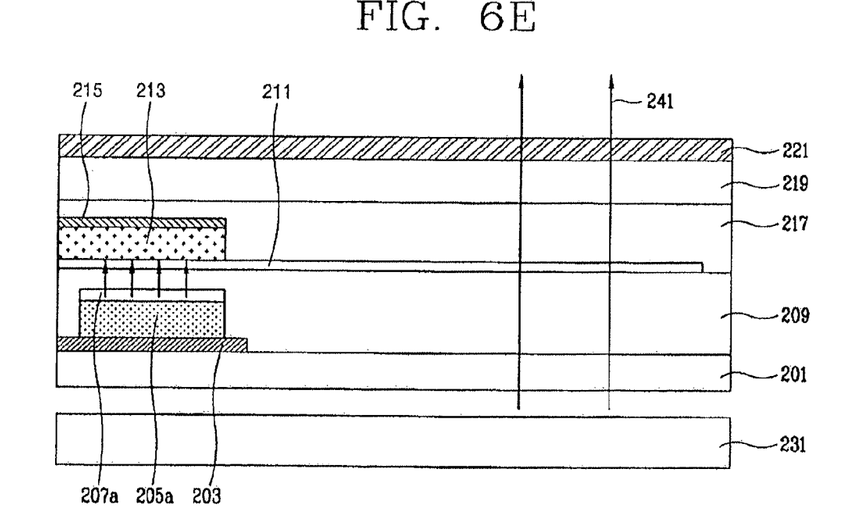

Next, with reference to FIG. 6E, a material layer for forming a photocurrent media layer and a conductive material layer for forming a signal electrode are sequentially deposited on the first passivation layer 209 including the floating electrode 211 of the second polymer unit 220.

Subsequently, the conductive material layer and the photocurrent media layer are selectively patterned through the exposing and developing process using photolithography to form a photocurrent media layer 213 and a signal electrode 215 of the second polymer unit 220 at positions corresponding to the polymer unit 210.

And then, a second passivation layer 217 is deposited on the entire surface of the substrate 201, including the photocurrent media layer 213 and the signal electrode 215, for planarization.

Thereafter, the upper substrate 221 is disposed to be spaced from the lower substrate 201 and the liquid crystal layer 219 is formed between the upper and lower substrates 221, 201 to thus complete fabrication of the LCD.

According to the display device fabricated according to the sequential processes, the LED is illuminated while applying a certain pulse type signal (namely, a gate signal of the general TFT), and second polymer unit 220 is activated while generating photocurrent by the generated light.

In this case, when a video signal is applied through the signal electrode 215, current or a certain voltage is applied through the floating electrode 211, which is the lower electrode of the second polymer unit 220.

In order to prevent noise due to an external tube, the upper electrode 215 (signal electrode) of the second polymer unit 220 and the lower electrode 203 (pulse electrode) of the first polymer unit 210 may be made of a metal (aluminum) with high electrical conductivity and high reflectivity.

The lower electrode 211 (floating electrode) of the second polymer unit 220 and the upper electrode 207a (common electrode) of the first polymer unit 220 may be made of a conductive material with good light transmittance, for example, ITO.

Compared with the general TFT, the dimension of an electric conduction path in the current TFT is about 100,000 times greater, so although the current TFT has electric conductivity (the second polymer unit) of a level of 1/10,000~100,000, no problem arises in operating the device.

In implementing the structure, sputtering, evaporation and organic film coating equipment, which do not excessively increase processing costs, are used, so the productivity can be considerably improved.

When the structure of the third polymer unit is employed for the organic EL device, a display is implemented on the related art single substrate, and when the structure of the third polymer unit is used as a liquid crystal material, it can substitute for the TFT substrate of the general TFT-LCD.

As so far described, the LCD and its fabrication method according to the present disclosure may have the following advantages.

Because inexpensive equipment is used, initial investment costs of a fabrication facility may be reduced, material costs and processing time may be shortened, and the luminous efficiency may be enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A display device comprising:
a first element unit formed on a lower substrate and including a reflector layer, a first light collecting part and a common electrode;
a second element unit formed on the first element unit and including a floating electrode, a photocurrent layer and a signal electrode, wherein the floating electrode and the signal electrode of the second element unit are used as source and drain electrodes of a thin film transistor;
an upper substrate attached with the lower substrate; and
a liquid crystal layer formed between the lower and upper substrates.

2. The device of claim 1, wherein the first reflection layer is used as a signal electrode.

3. The device of claim 1, wherein the first element unit is used as an illumination layer.

4. The device of claim 1, wherein the first and second element units are first and second polymer units.

* * * * *